US007016507B1

(12) United States Patent
Brennan

(10) Patent No.: US 7,016,507 B1
(45) Date of Patent: Mar. 21, 2006

(54) METHOD AND APPARATUS FOR NOISE REDUCTION PARTICULARLY IN HEARING AIDS

(75) Inventor: Robert Brennan, Kitchener (CA)

(73) Assignee: AMI Semiconductor Inc., Pocatello, ID (US)

( * ) Notice: Subject to any disclaimer, the term of this patent is extended or adjusted under 35 U.S.C. 154(b) by 0 days.

(21) Appl. No.: 09/060,825

(22) Filed: Apr. 16, 1998

Related U.S. Application Data

(60) Provisional application No. 60/041,991, filed on Apr. 16, 1997.

(51) Int. Cl.
*A61F 11/06* (2006.01)
*G10K 11/16* (2006.01)
*H03B 29/00* (2006.01)

(52) U.S. Cl. ............ 381/71.6; 381/23.1; 704/216
(58) Field of Classification Search ............ 381/71.6, 381/23.1, 94.1, 71.11, 94.2–94.9, 71.1, 312; 704/216, 233, 207, 206, 226, 217, 205
See application file for complete search history.

(56) References Cited

U.S. PATENT DOCUMENTS

| | | | |
|---|---|---|---|
| 4,283,601 A * | 8/1981 | Nakajima | 704/233 |
| 4,628,529 A * | 12/1986 | Borth et al. | 381/94.3 |
| 4,658,426 A | 4/1987 | Chabries et al. | 381/94 |
| 4,791,672 A | 12/1988 | Nunley et al. | 381/68.2 |
| 4,845,753 A * | 7/1989 | Yasunaga | 704/217 |
| 4,924,508 A * | 5/1990 | Crepy et al. | 704/207 |
| 5,133,013 A | 7/1992 | Munday | 381/47 |
| 5,337,366 A * | 8/1994 | Eguchi et al. | 381/71.11 |
| 5,479,522 A * | 12/1995 | Lindemann et al. | 381/23.1 |
| 5,485,522 A | 1/1996 | Sölve et al. | 381/56 |
| 5,544,250 A | 8/1996 | Urbanski | |
| 5,742,694 A * | 4/1998 | Eatwell | 381/94.2 |

(Continued)

FOREIGN PATENT DOCUMENTS

EP    0558 312 A    9/1993

(Continued)

OTHER PUBLICATIONS

Sheikhzadeh et al. Comparative Performance of Speciral Subtraction and HMM-Based Speech Enhancement Stratagies with Application to hearing Aid Design, Acoustics, Speech, and Signal Processing, ICASSP, 1994 IEEE Int. Conf. Apr. 19-22, 1994, pp. 1/13-16.*

(Continued)

*Primary Examiner*—Vivian Chin
*Assistant Examiner*—Con P. Tran
(74) *Attorney, Agent, or Firm*—Bereskin & Parr

(57) ABSTRACT

This invention describes a practical application of noise reduction in hearing aids. Although listening in noisy conditions is difficult for persons with normal hearing, hearing impaired individuals are at a considerable further disadvantage. Under light noise conditions, conventional hearing aids amplifying the input signal sufficiently to overcome the hearing loss. For a typical sloping hearing loss where there is a loss in high frequency hearing sensitivity, the amount of boost (or gain) rises with frequency. Most frequently, the loss in sensitivity is only for low-level signals; high level signals are affective minimally or not at all. A compression hearing aid is able to compensate by automatically lowering the gain as the input signal level rises. This compression action is usually compromised under noisy conditions. In general, hearing aids are of lesser benefit under noisy conditions since both noise and speech are boosted together when what is really required is a reduction of the noise relative to the speech. A noise reduction algorithm with the dual purpose of enhancing speech relative to noise and also providing a relatively clean signal for the compression circuitry is described.

32 Claims, 3 Drawing Sheets

U.S. PATENT DOCUMENTS

| | | | |
|---|---|---|---|
| 5,742,927 A | | 4/1998 | Crozier et al. ............... 704/226 |
| 5,768,473 A | | 6/1998 | Eatwell et al. .............. 395/2.35 |
| 5,794,187 A | | 8/1998 | Franklin et al. ............ 704/225 |
| 5,809,455 A | * | 9/1998 | Nishiguchi et al. .......... 704/214 |
| 5,825,754 A | | 10/1998 | Williams ..................... 370/290 |
| 5,903,655 A | * | 5/1999 | Salmi et al. ................. 381/321 |

FOREIGN PATENT DOCUMENTS

| | | | |
|---|---|---|---|
| EP | 0637 012 A | 2/1995 | |
| WO | WO-96/24128 | * 8/1996 | ................ 381/94.2 |

OTHER PUBLICATIONS

Sheikhzadeh, Brennan and Sameti, *Real-Time Implementation of HMM-Based Algorithms for Speech Enhancement in Hearing Aid Applications*, Proc. ICASSP 1995, vol. 5, pp. 808-811.

Sheikhzadeh, Sameti, Deng and Brennan, *Comparative Performance of Spectral Subtraction and HMM-Based Speech Enhancement Strategies with Applications to Hearing Aid Design*, Proc. ICASSP 1994, vol. 1, pp I-13-I-16.

Donald G. Jamieson et al. *Evaluation of Speech Enhancement Strategies for Normal and Hearing-Impaired Listeners*, Cannes-Madelieu (France), Nov. 10-13, 1992, Proceedings—Speech Processing in Adverse Conditions.

McAulay, Robert J. et al., "Speech Enhancement Using a Soft-Decision Noise Suppression Filter", IEEE Transactions on Acoustics, Speech and Signal Processing, vol. ASSP-28, No. 2, Apr. 1980, pp. 137-145.

* cited by examiner

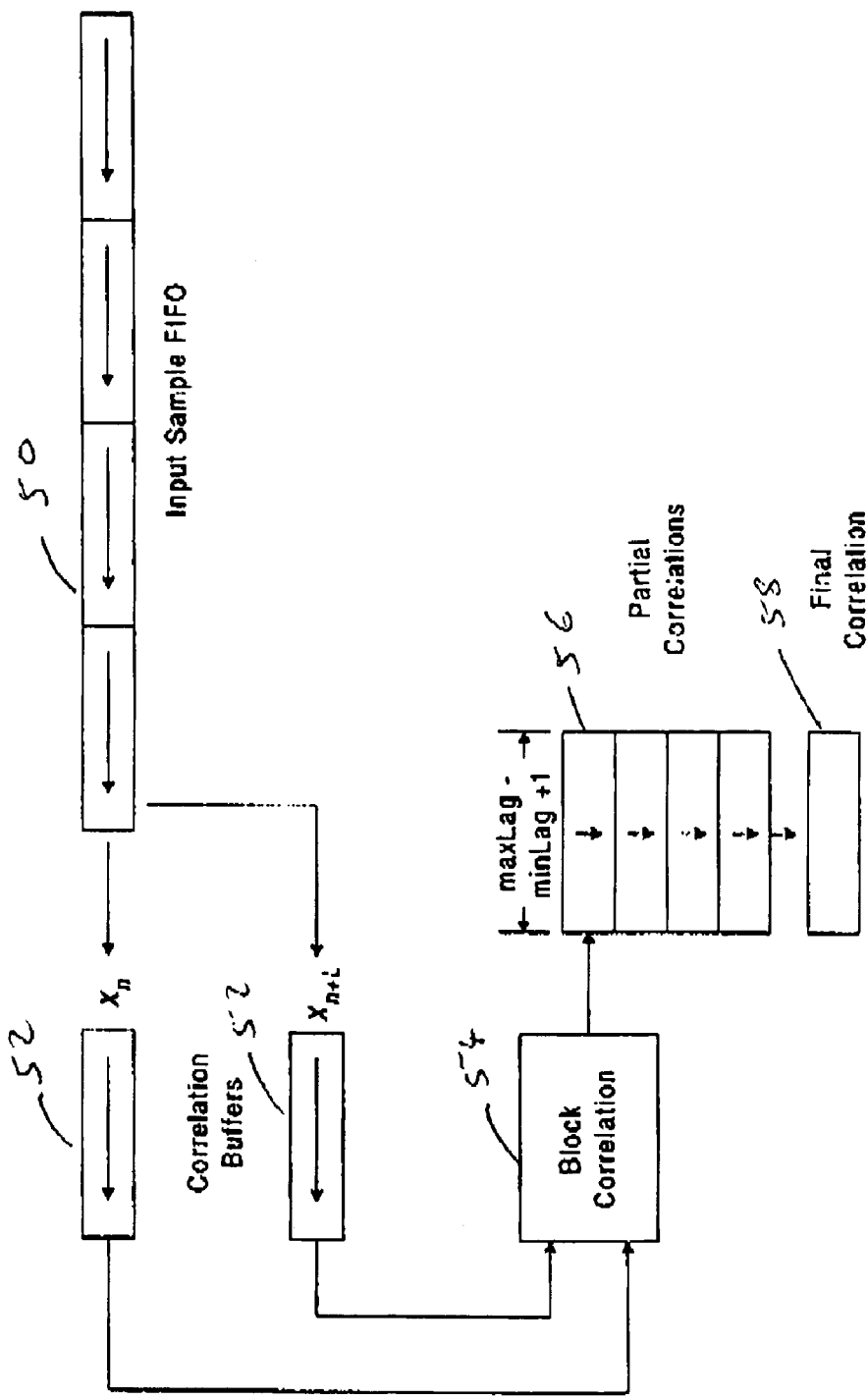
Figure 3: Modified autocorrelation performed in segments

METHOD AND APPARATUS FOR NOISE REDUCTION PARTICULARLY IN HEARING AIDS

CROSS-REFERENCE TO RELATED APPLICATION

This application claims benefit from U.S. provisional application Ser. No. 60/041,991 filed on Apr. 16, 1997.

FIELD OF THE INVENTION

This invention relates to noise reduction in audio or other signals and more particularly relates to noise reduction in digital hearing aids.

BACKGROUND OF THE INVENTION

Under noisy conditions, hearing impaired persons are severely disadvantaged compared to those with normal hearing. As a result of reduced cochlea processing, hearing impaired persons are typically much less able to distinguish between meaningful speech and competing sound sources (i.e., noise). The increased attention necessary for understanding of speech quickly leads to listener fatigue. Unfortunately, conventional hearing aids do little to aid this problem since both speech and noise are boosted by the same amount.

Compression algorithms used in some hearing aids boost low level signals to a greater extent than high level signals. This works well with low noise signals by raising low level speech cues to audibility. At high noise levels, compression performs only modestly since the action of the compressor is unduly influenced by the noise and merely boosts the noise floor. For persons that frequently work in high ambient sound environments, this can lead to unacceptable results.

BRIEF SUMMARY OF THE INVENTION

The present invention provides a two-fold approach to sound quality improvement under high noise situations and its practical implementation in a hearing aid. In one aspect, the present invention removes noise from the input signal and controls a compression stage with a cleaner signal, compared to the use of the original noisy input signal for controlling compression as is done in the prior art. The signal for amplification is, optionally, processed with a different noise reduction algorithm. Under certain circumstances, it may be desirable to use the same noise reduced signal for application and compression control in which case the two noise reduction blocks merge. In another instance, it may be desirable to alter or eliminate the noise reduction in the upper path.

Clearly, noise reduction is not suitable for all listening situations. Any situation where a desired signal could be confused with noise is problematic. Typically these situations involve non-speech signals such as music. A remote control or hearing aid control will usually be provided for enabling or disabling noise reduction.

The present invention is based on the realization that, what is required, is a technique for boosting speech or other desired sound source, while not boosting noise, or at least reducing the amount of boost given to noise.

In accordance with a first aspect of the present invention, there is provided a method of reducing noise in a signal containing speech and noise related to each other by a signal to noise ratio, the method comprising the steps:

(1) detecting the presence and absence of speech;
(2) in the absence of speech, determining a noise magnitude spectral estimate ($|\hat{N}(f)|$);
(3) in the presence of speech, comparing the magnitude spectrum of the input signal ($|X(f)|$) to the noise magnitude spectral estimate ($|\hat{N}(f)|$);
(4) calculating an attenuation function ($H(f)$) from the magnitude spectrum of the input signal ($|X(f)|$) and the noise magnitude spectral estimate ($|\hat{N}(f)|$), the attenuation function ($H(f)$) being dependent on the signal to noise ratio; and,
(5) modifying the input signal by the attenuation function ($H(f)$), to generate a noise reduced signal wherein there is no substantial modification to the input signal for very low and for very high signal to noise ratios.

Preferably, the method further comprises the steps of:
(6) supplying the input signal to an amplification unit;
(7) providing the noise reduced signal to a compression circuit which generates a control signal for the amplification unit; and,
(8) controlling the amplification unit with the control signal to modify the input signal to generate an output signal with compression and reduced noise. Advantageously, step (6) comprises subjecting the input signal to a main noise reduction algorithm to generate a main noise reduced signal and providing the main noise reduced signal to the amplification unit.

Furthermore, in one embodiment, step (6) comprises applying the steps (1) to (5) to the input signal prior to supplying the input signal to the amplification unit. Accordingly, the input signal may be subjected to a main noise reduction algorithm to generate a modified input signal which is supplied to the amplification unit. The auxiliary noise reduction algorithm may comprise the same noise reduction method as the main noise reduction algorithm. Alternatively, the auxiliary noise reduction algorithm may be different from the noise reduction method in the main noise reduction algorithm.

Conveniently, the square of the speech magnitude spectral estimate ($|\hat{S}(f)|$) may be determined by subtracting the square of the noise magnitude spectral estimate ($|\hat{N}(f)|$) from the square of the magnitude spectrum of the input signal ($|X(f)|$). In a preferred embodiment, the attenuation factor is a function of frequency and is calculated in accordance with the following equation:

$$H(f) = \left[ \frac{|X(f)|^2 - \beta|\hat{N}(f)|^2}{|X(f)|^2} \right]^\alpha$$

where f denotes frequency, $H(f)$ is the attenuation function, $|X(f)|$ is the magnitude spectrum of the input audio signal; ($|\hat{N}(f)|$) is the noise magnitude spectral estimate, $\beta$ is an oversubtraction factor and $\alpha$ is an attenuation rule, wherein $\alpha$ and $\beta$ are selected to give a desired attenuation function. The oversubtraction factor $\beta$ is, preferably, varied as a function of the signal to noise ratio, with $\beta$ being zero for high and low signal to noise ratios and with $\beta$ being increased as the signal to noise ratio increases above zero to maximum value at a predetermined signal to noise ratio and for higher signal to noise ratios $\beta$ decreases to zero at a second predetermined signal to noise ratio greater than the first predetermined signal to noise ratio.

Advantageously, the oversubtraction factor $\beta$ is divided by a preemphasis function of frequency $P(f)$ to give a modified oversubtraction factor $\hat{\beta}(f)$, the preemphasis function being such as to reduce $\hat{\beta}(f)$ at high frequencies, to reduce attenuation at high frequencies.

Preferably, the rate of the attenuation factor is controlled to prevent abrupt and rapid changes in the attenuation factor, and it preferably is calculated in accordance with the following equation where $G_n(f)$ is the smoothed attenuation function at the n'th time frame:

$$G_n(f)=(1-\gamma)H(f)+\gamma G_{n-1}(f)$$

The oversubtraction factor $\beta$ can be a function of perceptual distortion.

The method can include remotely turning noise suppression on and off. The method can include automatically disabling noise reduction in the presence of very light noise or extremely adverse environments.

Another aspect of the present invention provides for a method of detecting the presence or the absence of speech in an audio signal, the method comprising taking a block of the audio signal and performing an auto-correlation on that block to form a correlated signal; and checking the correlated signal for the presence of a periodic signal having a pitch corresponding to that for speech.

In a further aspect the present invention provides an apparatus for reducing noise in an input signal, the apparatus including an input for receiving the input signal. The apparatus comprises a compression circuit for receiving a compression control signal and generating an amplification control signal in response, and an amplification unit for receiving the input signal and the amplification control signal and generating an output signal with compression and reduced noise. The apparatus further comprises an auxiliary noise reduction unit connected to the input for generating an auxiliary noise reduced signal, the compression control signal being the auxiliary noise reduced signal.

The apparatus may further comprise a main noise reduction unit connected to the input for generating a noise reduced signal and supplying the noise reduced signal in place of the input signal to the amplification unit.

Preferably, the input signal contains speech and the main noise reduction unit comprises a detector connected to the input and providing a detection signal indicative of the presence of speech and a magnitude means for determining the magnitude spectrum of the input signal (|X(f)|), with both the detector and the magnitude means being connected to the input of the apparatus. The main noise reduction unit further comprises a spectral estimate means for generating a noise magnitude spectral estimate (|N̂(f)|) and being connected to the detector and to the input of the apparatus, a noise filter calculation unit connected to the spectral estimate means and the magnitude means, for receiving the noise magnitude spectral estimate (|N̂(f)|) and magnitude spectrum of the input signal (|X(f)|) and calculating an attenuation function (H(f)), and a multiplication unit coupled to the noise filter calculation unit and the input signal for producing the noise reduced-signal.

BRIEF DESCRIPTION OF THE DRAWING FIGURES

For a better understanding of the present invention and to show more clearly how it may be carried into effect, reference will now be made, by way of example, to the accompanying drawings in which:

FIG. 3 shows a modified auto-correlation scheme performed in segments.

DESCRIPTION OF THE PREFERRED EMBODIMENT

Figure 1:
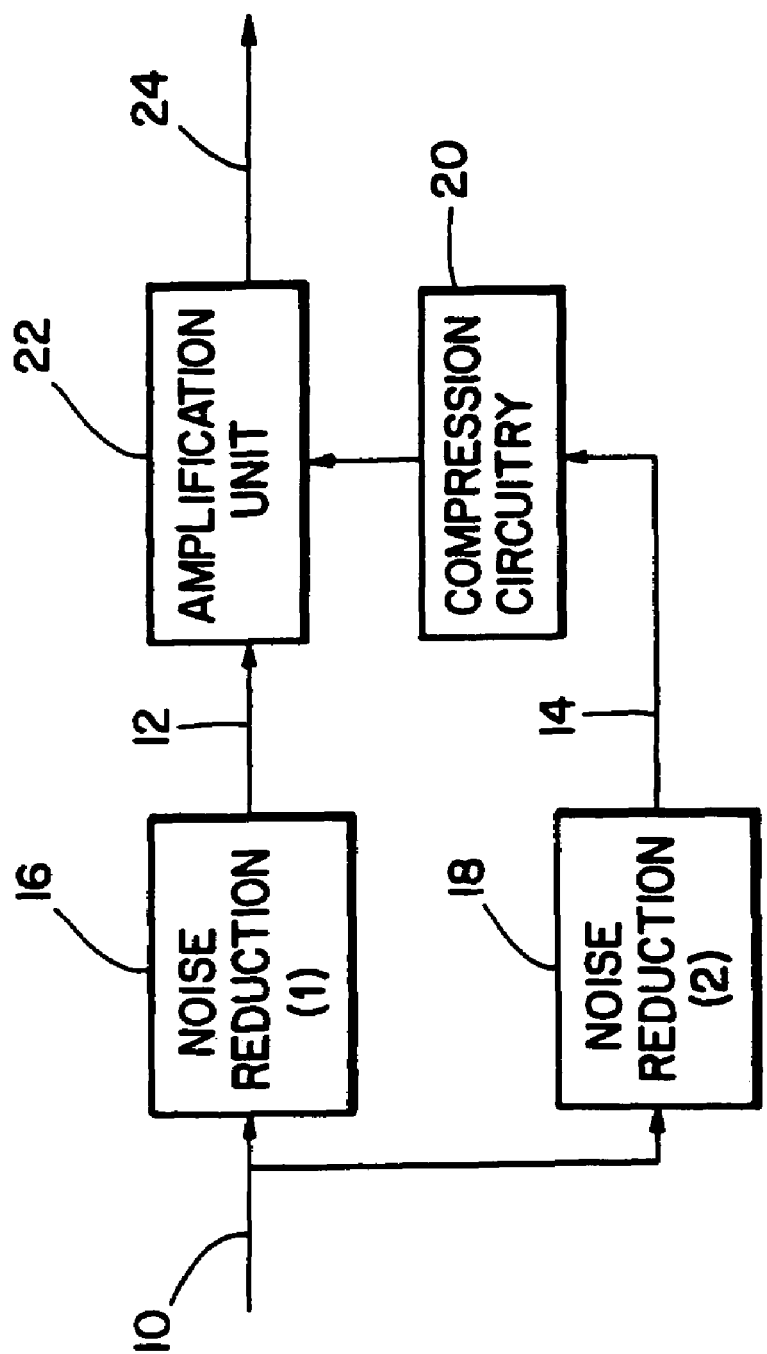
FIG. 1 is a conceptual blocked diagram for hearing aid noise reduction and compression.

Referring first to FIG. 1, there is shown schematically a basic strategy employed by the present invention. An input 10 for a noisy signal is split into two paths 12 and 14. In the upper path 12, the noise reduction is effected as indicated in block 16. In the lower path 14, noise reduction is effected in unit 18. The noise reduction unit 18 provides a cleaner signal that is supplied to compression circuitry 20, and the compression circuitry controls amplification unit 22 amplifying the signal in the upper path to generate an output signal at 24.

Here, the position of the noise reduction unit 18 can advantageously provide a cleaner signal for controlling the compression stage. The noise reduction unit 18 provides a first generating means which generates an auxiliary signal from an auxiliary noise reduction algorithm. The auxiliary algorithm performed by unit 18 may be identical to the one performed by unit 16, except with different parameters. Since the auxiliary noise reduced signal is not heard, unit 18 can reduce noise with increased aggression. This auxiliary signal, in turn, controls the compression circuitry 20, which comprises second generating means for generating a control input for controlling the amplification unit 22.

The noise reduction unit 16 is optional, and can be effected by using a different noise reduction algorithm from that in the noise reduction unit 18. If the same algorithm is used for both noise reduction processes 16 and 18, then the two paths can be merged prior to being split up to go to units 20 and 22. As noted, the noise reduction in the upper path may be altered or eliminated.

Figure 2:
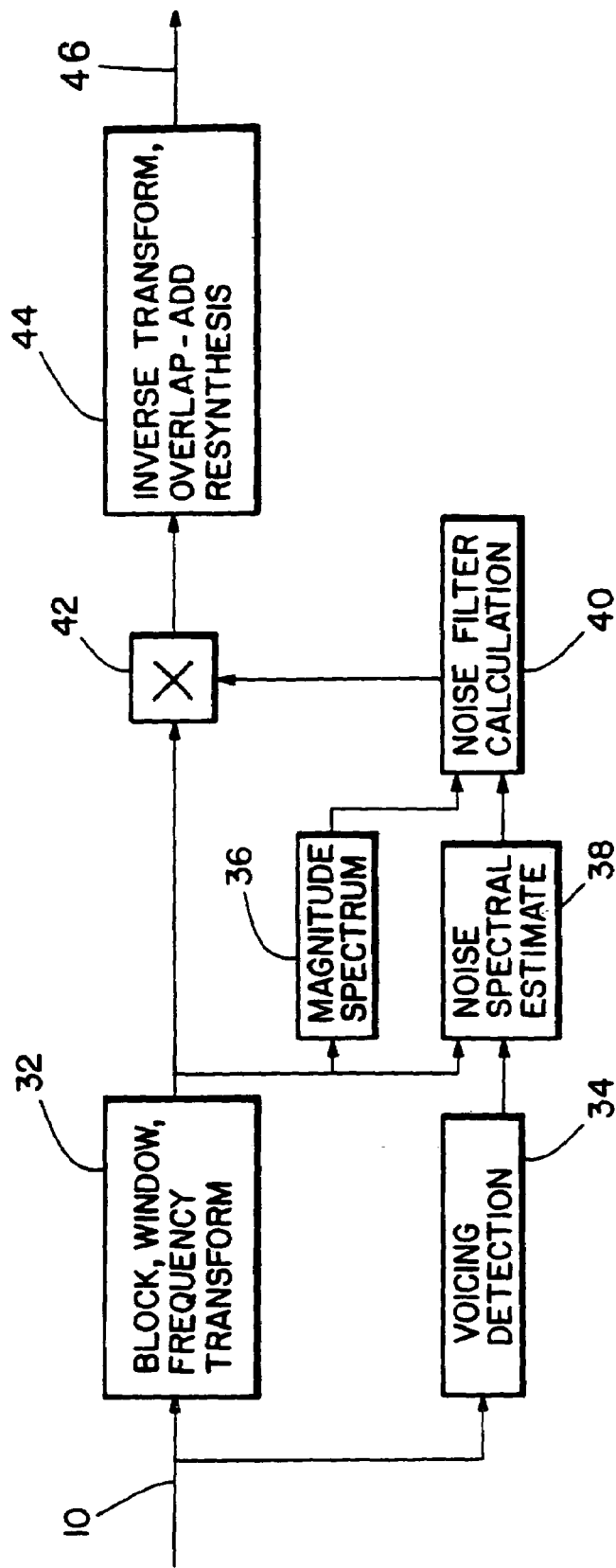
FIG. 2 shows a detailed blocked diagram for noise reduction in a hearing aid.

With reference to FIG. 2, this shows a block diagram of a specific realization of the proposed noise reduction technique which is preferably carried out by noise reduction unit 18 (and possibly also noise reduction unit 16). The incoming signal at 10 is first blocked and windowed, as detailed in applicant's simultaneously filed international application Ser. No. PCT/CA98/00329 corresponding to international publication no. WO 98/47313 which is incorporated herein by reference. The blocked and windowed output provides the input to the frequency transform (all of these steps take place, as indicated, at 32), which preferably here is a Discrete Fourier Transform (DFT),to provide a signal X(f). The present invention is not however restricted to a DFT and other transforms can be used. A known, fast way of implementing a DFT with mild restrictions on the transform size is the Fast Fourier Transform (FFT). The input 10 is also connected to a speech detector 34 which works in parallel to isolate the pauses in the incoming speech. For simplicity, reference is made here to "speech", but it will be understood that this encompasses any desired audio signal, capable of being isolated or detected by detector 34. These pauses provide opportunities to update the noise spectral estimate. This estimate is updated only during speech pauses as a running slow average. When speech is detected, the noise estimate is frozen.

As indicated at 38, the outputs from both the unit 32 and the voice detection unit 34 are connected to block 38 which detects the magnitude spectrum of the incoming noise, |N̂(f)|. The magnitude spectrum detected by unit 38 is an estimate. The output of unit 32 is also connected to block 36 for detecting the magnitude spectrum of the incoming noisy signal, |X(f)|.

A noise filter calculation 40 is made based on |X(f)| and |Ñ(f)|, to calculate an attenuation function H(f). As indicated at 42, this is used to control the original noisy signal X(f) by multiplying X(f) by H(f). This signal is subject to an inverse transform and overlap-add resynthesis in known manner at 44, to provide a noise reduced signal 46. The noise reduced signal 46 in FIG. 2 may correspond to either of the signal at 12 or 14 in FIG. 1.

During speech utterances, the magnitude spectrum is compared with the noise spectral estimate. In general, frequency dependent attenuation is calculated as a function of the two input spectra. Frequency regions where the incoming signal is higher than the noise are attenuated less than regions where the incoming signal is comparable or less than the noise. The attenuation function is generally given by $$H(f) = \left[ \frac{|S(f)|^2}{|S(f)|^2 + |N(f)|^2} \right]^\alpha$$

where H(f) is the attenuation as a function of frequency
S(f) is the clean speech spectrum
N(f) is the noise spectrum
α is the attenuation rule The attenuation rule preferably selected is the Wiener attenuation rule which corresponds to α equal to 1. The Wiener rule minimizes the noise power relative to the speech. Other attenuation rules can also be used, for example the spectral subtraction rule having α equal to 0.5.

Since neither S(f) nor N(f) are precisely known and wold require a priori knowledge of the clean speech and noise spectra, they are replaced by estimates Ŝ(f) and Ñ(f):

$$|\hat{S}(f)|^2 = |\hat{N}(f)|^2$$

where X(f) is the incoming speech spectrum and Ñ(f) is the noise spectrum as estimated during speech pauses. Given perfect estimates of the speech and noise spectra, application of this formula yields the optimum (largest) signal-to-noise-ratio (SNR). Although the SNR would be maximized using this formula, the noise in the resulting speech is still judged as excessive by subjective assessment. An improved implementation of the formula taking into account these perceptual aspects is given by:

$$H(f) = \left[ \frac{|X(f)|^2 - \beta |\hat{N}(f)|^2}{|X(f)|^2} \right]^\alpha$$

where: β is an oversubtraction factor
α is the attenuation rule
H(f) should be between 0.0 and 1.0 to be meaningful. When negative results are obtained, H(f) simply set to zero at that frequency. In addition, it is beneficial to increase the minimum value of H(f) somewhat above zero to avoid complete suppression of the noise. While counter-intuitive, this reduces the musical noise artifact (discussed later) to some extent. The parameter α governs the attenuation rule for increasing noise levels. Generally, the higher α is set, the more the noise is punished as X(f) drops. It was found that the best perceptual results are obtained with α=1.0. The special case of α=1.0 and β=1.0 corresponds to power spectrum subtraction yielding the Wiener filter solution as described above.

the parameter β controls the amount of additional noise suppression required; it is ideally a function of the input noise level. Empirically it was noticed that under very light noise (SNR>40 dB) β should be zero. For lower SNR signals, the noise reduction become less reliable and is gradually turned off. An example of this additional noise reduction is:

$$\beta = 0 \quad \text{for } SNR < 0$$
$$\beta = \beta_0 \frac{SNR}{5} \quad \text{for } 0 < SNR < 5$$
$$\beta = \beta_0 \left[ 1 - \frac{(SNR - 5)}{35} \right] \quad \text{for } 5 < SNR < 40$$
$$\beta = 0 \quad \text{for } SNR > 40$$

In this example, $\beta_0$ refers to the maximum attenuation, 5.0. In effect, from SNR=0, the attenuation β is ramped up uniformly to a maximum, $\beta_0$, at SNR=5, and this is then uniformly ramped down to zero at SNR=40.

Another aspect of the present invention provides improvements in perceptual quality making β a function of frequency. As an instance of the use of this feature, it was found that to avoid excessive attenuation of high frequency information, it was necessary to apply a preemphasis function, P(f), to the input spectrum X(f), where P(f) is an increasing function of frequency. The effect of this preemphasis function is to artificially raise the input spectrum above the noise floor at high frequencies. The attenuation rule will then leave the higher frequencies relatively intact. This preemphasis is conveniently accomplished by reducing β at high frequencies by the preemphasis factor.

$$\hat{\beta}(f) = \frac{\beta}{P(f)}$$

where $\hat{\beta}$ is β after preemphasis.

Without further modification, the above formula can yield noise reduced speech with an audible artifact known as musical noise. This occurs, because in order for the noise reduction to be effective in reducing noise, the frequency attenuation function has to be adaptive. The very act of adapting this filter allows isolated frequency regions of low SNR to flicker in and out of audibility leading to this musical noise artifact. Various methods are used to reduce this problem. Slowing down the adaptation rate significantly reduces this problem. In this method, a forgetting factor, γ is introduced to slow abrupt gain changes in the attenuation function:

$$G_n(f) = (1-\gamma) I(f) + \gamma G_{n-1}(f)$$

where $G_n(f)$ and $G_{n-1}(f)$ are the smoothed attenuation functions at the n'th and (n-1)'th time frames.

Further improvements in perceptual quality are possible by making β (in addition to being a function of frequency) a function of perceptual distortion. In this method, the smoothing function (instead of a simple exponential or forgetting factor as above) bases its decision on adapting $G_n(f)$ on whether such a change is masked perceptually. The perceptual adaptation algorithm uses the ideal attenuation function II(f) as a target because it represents the best SNR attainable. The algorithm decides how much $G_n(f)$ can be adjusted while minimizing the perceptual distortion. The decision is based on a number of masking criteria in the output spectrum including:

1. Spread of masking—changes in higher frequency energy are masked by the presence of energy in frequencies in the vicinity—especially lower frequencies;
2. Previous energy—changes in louder frequency components are more audible that changes in weaker frequency components;
   3. Threshold of hearing—there is no point in reducing the noise significantly below the threshold of hearing at a particular frequency;
4. Previous attenuation—low levels should not be allowed to jump up rapidly—high levels should not suddenly drop rapidly unless masked by 1), 2) or 3).

For applications where the noise reduction is used to preprocess the input signal before reaching the compression circuitry (schematically shown in FIG. 1), the perceptual characteristics of the noise reduced signal are less important. In fact, it may prove advantageous to perform the noise reduction with two different suppression algorithms as mentioned above. The noise reduction 16 would be optimized for perceptual quality while the other noise reduction 18 would be optimized for good compression performance.

A key element to the success of the present noise suppression or reduction system is the speech or voicing detector. It is crucial to obtain accurate estimates of the noise spectrum. If the noise spectral estimate is updated during periods of speech activity, the noise spectrum will be contaminated with speech resulting in speech cancellation. Speech detection is very difficult, especially under heavy noise situations. Although, a three-way distinction between voiced speech, unvoiced speech (consonants) and noise is possible under light noise conditions, it was found that the only reliable distinction available in heavy noise was between voiced speech and noise. Given the slow averaging of the noise spectrum, the addition of low-energy consonants is insignificant.

Thus, another aspect of the present invention uses an auto-correlation function to detect speech, as the advantage of this function is the relative ease with which a periodic signal is detected. As will be appreciated by those skilled in the art, an inherent property of the auto-correlation function of a periodic signal is that it shows a peak at the time lag corresponding to the repetition Period (see Rabiner, L, R., and Schafer, R. W., *Digital Processing of Speech Signals*, (Prentice Hall Inc., 1978) which is incorporated herein by reference). Since voiced speech is nearly periodic in time at the rate of its pitch period, a voicing detector based on the auto-correlation function was developed. Given a sufficiently long auto-correlation, the uncorrelated noise tends to cancel out as successive pitch periods are averaged together.

A strict short-time auto-correlation requires that the signal first be blocked to limit the time extent (samples outside the block are set to zero). This operation is followed by an auto-correlation on the block. The disadvantage of this approach is that the auto-correlation function includes fewer samples as the time lag increases. Since the pitch lag (typically between 40 and 240 samples (equivalent to 2.5 to 15 milliseconds) is a significant portion of the auto-correlation frame (typically 512 samples or 32 milliseconds), a modified version of the auto-correlation function avoiding this problem was calculated. This modified version of the auto-correlation function is described in Rabiner, L. R., and Schafer, R. W., *Digital Processing of Speech Signals, supra*. In this method, the signal is blocked and correlated with a delayed block (of the same length) of the signal. Since the samples in the delayed block include samples not present in the first block, this function is not a strict auto-correlation but shows periodicities better.

It is realized that a hearing aid is a real-time system and that all computational elements for each speech block are to be completed before the next arrives. The calculation time of a long auto-correlation, which is required only every few speech blocks, would certainly bring the system to a halt every time it must be calculated. It is therefore recognized that the auto-correlation should be segmented into a number of shorter sections which can be calculated for each block and stored in a partial correlation table. The complete auto-correlation is determined by stacking these partial correlations on top of each other and adding as shown in FIG. 3.

Referring to FIG. 3, input sample 50 is divided into separate blocks stored in memory buffers as indicated at 52. The correlation buffers 52 are connected to a block correlation unit 54, where the auto-correlation is performed. Partial cross-correlations 56 are summed to give the final correlation 58.

This technique quickly yields the exact modified auto-correlation and is the preferred embodiment when sufficient memory is available to store the partial correlations.

When memory space considerations rule out the above technique, a form of exponential averaging may be used to reduce the number of correlation buffers to a single buffer. In this technique, successive partial correlations are summed to the scaled down previous contents of the correlation buffer. This simplification significantly reduces the memory but implicitly applies an exponential window to the input sequence. The windowing action, unfortunately, reduces time periodicities. The effect is to spread the autocorrelation peak to a number of adjacent time lags in either direction. This peak smearing reduces the accuracy of the voicing detection somewhat.

In the implementations using an FFT transform block, these partial correlations (for either technique given above) can be performed quickly in the frequency domain. For each block, the correlation operation is reduced to a sequence of complex multiplications on the transformed time sequences. The resulting frequency domain sequences can be added directly together and transformed back to the time domain to provide the complete long auto-correlation. In an alternate embodiment, the frequency domain correlation results are never inverted back to the time domain. In this realization, the pitch frequency is determined directly in the frequency domain.

Since the auto-correlation frame is long compared to the (shorter) speech frame, the voicing detection is delayed compared to the current frame. This compensation for this delay is accomplished in the noise spectrum update block.

An inter-frame constraint was placed on frames considered as potential candidates for speech pauses to further reduce false detection of noise frames. The spectral distance between the proposed frame and the previous estimates of the noise spectrum are compared. Large values reduce the likelihood that the frame is truly a pause. The voicing detector takes this information, the presence or absence of an auto-correlation peak, the frame energy, and a running average of the noise as inputs.

I claim:

1. A method of reducing noise in an input signal, said input signal containing speech and noise related to each other by a signal to noise ratio, the method comprising the steps:

(1) detecting the presence and absence of speech;
(2) in the absence of speech, determining a noise magnitude spectral estimate ($|\hat{N}(f)|$);
(3) in the presence of speech, comparing the magnitude spectrum of the input signal ($|X(f)|$) to the noise magnitude spectral estimate ($|\hat{N}(f)|$);
(4) calculating an attenuation function (H(f)) from the magnitude spectrum of the input signal ($|X(f)|$) and the noise magnitude spectral estimate ($|\hat{N}(f)|$), the attenuation function (H(f)) being dependent on the signal to noise ratio; and,
(5) modifying the input signal by the attenuation function (H(f)) to generate a noise reduced signal wherein there is no substantial modification to the input signal for very low and for very high signal to noise ratios.

2. A method as claimed in claim 1, further comprising the steps of:
(6) supplying the input signal to an amplification unit;
(7) providing the noise reduced signal to a compression circuit which generates a control signal for the amplification unit; and
(8) controlling the amplification unit with the control signal to modify the input signal to generate an output signal with compression and reduced noise.

3. A method as claimed in claim 2, wherein step (6) comprises subjecting the input signal to a main noise reduction algorithm to generate a main noise reduced signal and providing the main noise reduced signal to the amplification unit.

4. A method as claimed in claim 3, wherein the main noise reduction algorithm comprises the method of claim 1.

5. A method as claimed in claim 3, wherein the main noise reduction algorithm is different from the method of claim 1.

6. A method as claimed in claim 2, wherein step (6) comprises applying steps (1) to (5) to the input signal prior to supplying the input signal to the amplification unit.

7. A method as claimed in claim 1, wherein the square of the speech magnitude spectral estimate ($|\hat{S}(f)|$) is determined by subtracting the square of the noise magnitude spectral estimate ($|\hat{N}(f)|$) from the square of the magnitude spectrum of the input signal ($|X(f)|$).

8. A method as claimed in claim 7, wherein the attenuation function is calculated in accordance with the following equation:

$$H(f) = \left[\frac{|X(f)|^2 - \beta|\hat{N}(f)|^2}{|X(f)|^2}\right]^\alpha$$

where H(f) is the attenuation function, $|X(f)|$ is the magnitude spectrum of the input signal; $|\hat{N}(f)|$ is the noise magnitude spectral estimate, $\beta$ is an oversubtraction factor and $\alpha$ is an attenuation rule, wherein $\alpha$ and $\beta$ are selected to give a desired attenuation function.

9. A method as claimed in claim 8, wherein the oversubtraction factor $\beta$ is varied as a function of the signal to noise ratio, with $\beta$ being zero for high and low signal to noise ratios and with $\beta$ being increased as the signal to noise ratio increases above zero to a maximum value at a predetermined signal to noise ratio and for higher signal to noise ratios $\beta$ decreases to zero at a second predetermined signal to noise ratio greater than the first predetermined signal to noise ratio.

10. A method as claimed in claim 9, wherein the oversubtraction factor $\beta$ is divided by a preemphasis function P(f) to give a modified oversubtraction factor $\hat{\beta}(f)$, the preemphasis function being such as to reduce $\hat{\beta}(f)$ at high frequencies, and thereby reduce attenuation at high frequencies.

11. A method as claimed in claim 8, wherein the rate of change of the attenuation function (H(f)) is controlled to prevent abrupt and rapid changes in the attenuation function (H(f)).

12. A method as claimed in claim 8, wherein the attenuation function (H(f)) is calculated at successive time frames, and the attenuation function (H(f)) is calculated in accordance with the following equation:

$$G_n(f) = (1-\gamma)H(f) + \gamma G_{n-1}(f)$$

wherein $G_n(f)$ and $G_{n-1}(f)$ are the smoothed attenuation functions at the n'th and (n−1)'th time frames, and $\gamma$ is a forgetting factor.

13. A method as claimed in claim 12, wherein $\beta$ is a function of perceptual distortion.

14. A method as claimed in claim 1 which includes remotely turning noise suppression on and off.

15. A method as claimed in claim 1 which includes automatically disabling noise reduction in the presence of very light noise or extremely adverse environments.

16. A method as claimed in claim 1 which includes detecting speech with a modified auto-correlation function.

17. A method as claimed in claim 16, wherein the auto-correlation function comprises:
(1) taking an input sample and separating it into short blocks and storing the blocks in correlation buffers;
(2) correlating the blocks with one another, to form partial correlations; and
(3) summing the partial correlations to obtain a final correlation.

18. A method as claimed in claim 17, wherein the method is carried out by digital signal processing and wherein the method includes using a Fast Fourier Transform to generate the partial correlations and includes detection of voiced speech directly in the frequency domain.

19. A method as claimed in claim 1, wherein detecting the presence or absence of speech comprises:
(1) taking a block of the input signal and performing an auto-correlation on that block to form a correlated signal; and,
(2) checking the correlated signal for the presence of a periodic signal having a pitch corresponding to that for a desired audio signal.

20. A method as claimed in claim 19, wherein the auto-correlation is performed on a first block taken from the input signal, and a delayed block from the audio signal.

21. A method as claimed in claim 20, wherein each block is subdivided into a plurality of shorter sections and the correlation comprises a correlation between pairs of the shorter sections to form partial correlations, and subsequently summing the partial correlations to obtain the correlated signal.

22. A method as claimed in claim 21, wherein an input signal is stored as a plurality of samples in a pair of correlation buffers, and the auto-correlation is performed on the signals in the buffers to determine the partial correlations, which partial correlations are summed and stored.

23. An apparatus, for reducing noise in a single input signal, the apparatus including an input for receiving the single input signal, the apparatus comprising:
(a) a compression circuit for receiving a compression control signal and generating an amplification control signal in response;

(b) an amplification unit for receiving an input amplification signal and the amplification control signal and generating an output signal with compression and reduced noise under the control of the amplification control signal;

(c) an auxiliary noise reduction unit connected to the input for generating an auxiliary noise reduced signal, the compression control signal being the auxiliary noise reduced signal; and, (d) a main noise reduction unit connected to the input and the amplification unit for receiving the single input signal and generating a noise reduced signal, the noise reduced signal being the input amplification signal;

wherein, the single input signal contains speech and noise related to each other by a signal to noise ratio and the main noise reduction unit generates the noise reduced signal in dependence upon the signal to noise ratio, wherein there is no substantial modification to the single input signal for very low and for very high signal to noise ratios.

24. An apparatus as claimed in claim 23, wherein the input signal contains speech and the main noise reduction unit comprises:

(1) a detector connected to said input and providing a detection signal indicative of the presence of speech;

(2) magnitude means for determining the magnitude spectrum of the input signal ($|X(f)|$), with both the detector and the magnitude means being connected to the input of the apparatus;

(3) spectral estimate means for generating a noise magnitude spectral estimate ($|\hat{N}(f)|$) and being connected to the detector and to the input of the apparatus;

(4) a noise filter calculation unit connected to the spectral estimate means and the magnitude means, for receiving the noise magnitude spectral estimate ($|N(f)|$) and magnitude spectrum of the input signal ($|X(f)|$) and calculating an attenuation function (H(f)); and, (5) a multiplication unit coupled to the noise filter calculation unit and the input signal for producing the noise reduced signal.

25. An apparatus as claimed in claim 24, which includes a frequency transform means connected between said input and both of the magnitude means and the spectral estimate means for transforming the signal into the frequency domain to provide a transformed signal (X(f)) wherein the magnitude means determines the magnitude spectrum ($|X(f)|$) from the transformed signal (X(f)), and wherein the spectral estimate means determines the noise spectral estimate ($|\hat{N}(f)|$) from the transformed signal (X(f)) in the absence of speech, the apparatus further including inverse frequency transform means for receiving a transformed noise reduced signal from the multiplication unit, the inverse frequency transform means providing the noise reduced signal.

26. An apparatus as claimed in claim 25, wherein the noise filter calculation unit determines the square of the speech magnitude spectral estimate by subtracting the square of the noise magnitude spectral estimate from the square of the magnitude spectrum of the input signal and wherein the noise filter calculation unit calculates the attenuation function (H(f)), as a function of frequency, in accordance with the following equation:

$$H(f) = \left[ \frac{|X(f)|^2 - \beta|\hat{N}(f)|^2}{|X(f)|^2} \right]^\alpha$$

where f denotes frequency, H(f) is the attenuation function, $|X(f)|$ is the magnitude spectrum of the input audio signal; $|\hat{N}(f)|$ is the noise magnitude spectral estimate, $\beta$ is an oversubtraction factor and $\alpha$ is an attenuation rule, wherein $\alpha$ and $\beta$ are selected to give a desired attenuation function.

27. An apparatus as claimed in claim 23, wherein the main noise reduction unit and the auxiliary noise reduction unit employ the same noise reduction algorithm.

28. An apparatus as claimed in claim 23, wherein the auxiliary noise reduction unit is different from the main noise reduction unit.

29. A method of reducing noise in an input signal, said input signal containing speech and noise related to each other by a signal to noise ratio, the method comprising the steps:

(1) detecting the presence and absence of speech;

(2) in the absence of speech, determining a noise magnitude spectral estimate ($|\hat{N}(f)|$);

(3) in the presence of speech, comparing the magnitude spectrum of the input signal ($|X(f)|$) to the noise magnitude spectral estimate ($|\hat{N}(f)|$);

(4) calculating an attenuation function (H(f)) from the magnitude spectrum of the input signal ($|X(f)|$) and the noise magnitude spectral estimate ($|\hat{N}(f)|$), the attenuation function (H(f)) being dependent on the signal to noise ratio; and, (5) modifying the input signal by the attenuation function (H(f)) to generate a noise reduced signal wherein there is no substantial modification to the input signal for very low and for very high signal to noise ratios and wherein the amount of attenuation provided by the attenuation function is increased as the signal to noise ratio increases above zero to a maximum value at a predetermined signal to noise ratio and for higher signal to noise ratios the amount of attenuation provided by the attenuation function decreases to zero at a second predetermined signal to noise ratio greater than the first predetermined signal to noise ratio.

30. An apparatus, for reducing noise in an input signal containing speech and noise related to each other by a signal to noise ratio, the apparatus including an input for receiving the input signal, the apparatus comprising:

(a) a compression circuit for receiving a compression control signal and generating an amplification control signal in response;

(b) an amplification unit for receiving an input amplification signal and the amplification control signal and generating an output signal with compression and reduced noise; and, (c) an auxiliary noise reduction unit connected to the input for generating an auxiliary noise reduced signal, the compression control signal being the auxiliary noise reduced signal, wherein the auxiliary noise reduction unit generates the auxiliary noise reduced signal in dependence upon the signal to noise ratio, wherein there is no substantial modification to the input signal for very low and for very high signal to noise ratios.

31. An apparatus, for reducing noise in an input signal containing speech and noise related to each other by a signal to noise ratio, the apparatus including an input for receiving the input signal, the apparatus comprising:

(a) a compression circuit for receiving a compression control signal and generating an amplification control signal in response;

(b) an amplification unit for receiving the input signal and the amplification control signal and generating an output signal with compression and reduced noise; and, (c) an auxiliary noise reduction unit connected to the input for generating an auxiliary noise reduced signal, the compression control signal being the auxiliary noise reduced signal, wherein the auxiliary noise reduction unit generates the auxiliary noise reduced signal according to an attenuation function in dependence upon the signal to noise ratio, wherein there is no substantial modification to the input signal for very low and for very high signal to noise ratios and wherein the amount of attenuation provided by the attenuation function is increased as the signal to noise ratio increases above zero to a maximum value at a predetermined signal to noise ratio and for higher signal to noise ratios the amount of attenuation provided by the attenuation function decreases to zero at a second predetermined signal to noise ratio greater than the first predetermined signal to noise ratio.

32. An apparatus, for reducing noise in an input signal, the apparatus including an input for receiving the input signal, the apparatus comprising:

(a) a compression circuit for receiving a compression control signal and generating an amplification control signal in response;

(b) an amplification unit for receiving an input amplification signal and the amplification control signal and generating an output signal with compression and reduced noise under the control of the amplification control signal;

(c) an auxiliary noise reduction unit connected to the input for generating an auxiliary noise reduced signal, the compression control signal being the auxiliary noise reduced signal; and, (d) a main noise reduction unit connected to the input and the amplification unit for receiving the input signal and generating a noise reduced signal, the input amplification signal being the noise reduced signal;

wherein, the main noise reduction unit employs a first noise reduction algorithm and the auxiliary noise reduction unit employs a second noise reduction algorithm, the second noise reduction algorithm being adapted to attack noise more aggressively than the first noise reduction algorithm.

* * * * *

UNITED STATES PATENT AND TRADEMARK OFFICE
CERTIFICATE OF CORRECTION

PATENT NO.       : 7,016,507 B1
APPLICATION NO.  : 09/060825
DATED            : March 21, 2006
INVENTOR(S)      : Robert Brennan It is certified that error appears in the above-identified patent and that said Letters Patent is hereby corrected as shown below:

1. In the Abstract, line 6, the word "amplifying" has been changed to --amplify--.

2. In the Brief Summary of the Invention section, in column 2, line 39, the formula " $(\uparrow \hat{S}(f))$ " has been changed to -- $(|\hat{S}(f)|)$ --.

3. In Description of the Preferred Embodiment section, in column 4, line 52, the words "speech detector" has been changed to --voice detection unit--.

4. In Description of the Preferred Embodiment section, in column 4, line 56, the word "detector" has been changed to --voice detection unit--.

5. In the Description of The Preferred Embodiment section, in column 5, line 35, the formula " $|\hat{S}(f)|^2 - |\hat{N}(f)|^2$ " has been changed to -- $|\hat{S}(f)|^2 \approx |X(f)|^2 - |\hat{N}(f)|^2$ --.

6. In the Claims section, in column 10, line 13, the formula " $G_n(f) = (1-\gamma)H(f) + \gamma G_{n-1}(f)$ " has been changed to -- $G_n(f) = (1-\gamma)H(f) + \gamma G_{n-1}(f)$ --.

7. In the Claims section, in column 12, lines 47 and 48, the words --an input amplification-- has been changed to --the input--.

Signed and Sealed this

Seventh Day of November, 2006

JON W. DUDAS
*Director of the United States Patent and Trademark Office*